United States Patent
Kim et al.

(10) Patent No.: US 9,818,604 B2
(45) Date of Patent: Nov. 14, 2017

(54) METHOD FOR DEPOSITING INSULATING FILM ON RECESSED PORTION HAVING HIGH ASPECT RATIO

(71) Applicant: EUGENE TECHNOLOGY CO., LTD., Yongin-si, Gyeonggi-do (KR)

(72) Inventors: Hai-Won Kim, Icheon-si (KR); Chang-Hun Shin, Icheon-si (KR); Seok-Yun Kim, Yongin-si (KR); Choon-Sik Jeong, Yongin-si (KR)

(73) Assignee: EUGENE TECHNOLOGY CO., LTD., Yongin-si, Gyeonggi-do ( * ) Notice: Subject to any disclaimer, the term of this patent is extended or adjusted under 35 U.S.C. 154(b) by 0 days.

(21) Appl. No.: 15/323,295

(22) PCT Filed: Jun. 16, 2015

(86) PCT No.: PCT/KR2015/006055
§ 371 (c)(1),
(2) Date: Dec. 30, 2016

(87) PCT Pub. No.: WO2016/010267
PCT Pub. Date: Jan. 21, 2016

(65) Prior Publication Data
US 2017/0148625 A1 May 25, 2017

(30) Foreign Application Priority Data
Jul. 15, 2014 (KR) .................. 10-2014-0089285

(51) Int. Cl.
*H01L 21/471* (2006.01)
*H01L 21/02* (2006.01)
(Continued)

(52) U.S. Cl.
CPC ...... *H01L 21/0234* (2013.01); *H01L 21/0228* (2013.01); *H01L 21/02164* (2013.01);
(Continued)

(58) Field of Classification Search
CPC .......... H01L 21/02126; H01L 21/0214; H01L 21/02164; H01L 21/0217; H01L 21/02208;
(Continued)

(56) References Cited

U.S. PATENT DOCUMENTS 5,521,126 A 5/1996 Okamura et al.
8,912,101 B2 * 12/2014 Tsuji .................. H01L 21/0228
438/782

(Continued)

FOREIGN PATENT DOCUMENTS

JP 07-029897 A 1/1995
KR 10-2007-0028858 A 3/2007
KR 10-2012-0012582 A 2/2012

*Primary Examiner* — Stephen W Smoot
(74) *Attorney, Agent, or Firm* — Rabin & Berdo, P.C.

(57) ABSTRACT

Provided is a method of depositing an insulation layer on a trench in a substrate, in which the trench having an aspect ratio of 5:1 or more is formed, including: an insulation layer deposition step of performing an adsorption step of adsorbing silicon to the substrate by injecting a silicon precursor into the inside of a chamber into which the substrate is loaded, a first purge step of removing the unreacted silicon precursor and reaction byproducts from the inside of the chamber, a reaction step of forming the adsorbed silicon as an insulation layer including silicon by supplying a first reaction source to the inside of the chamber, and a second purge step of removing the unreacted first reaction source and reaction byproducts from the inside of the chamber; and a densification step of forming a plasma atmosphere in the inside of the chamber by applying an radio frequency (RF) power and densifying the insulation layer including silicon by using the plasma atmosphere, wherein a frequency of the RF power is in a range of 400 kHz to 2 MHz.

16 Claims, 11 Drawing Sheets (51) Int. Cl.
   *H01L 21/762*     (2006.01)
   *H01L 21/473*     (2006.01)
(52) U.S. Cl.
   CPC .. *H01L 21/02208* (2013.01); *H01L 21/02274* (2013.01); *H01L 21/473* (2013.01); *H01L 21/76224* (2013.01)
(58) Field of Classification Search
   CPC ........... H01L 21/02274; H01L 21/0228; H01L 21/0234; H01L 21/473
   See application file for complete search history.

(56) References Cited

U.S. PATENT DOCUMENTS

2013/0101752 A1    4/2013  Kim et al.
2015/0235844 A1*   8/2015  Wang ................ H01L 21/02274
                                                        438/667

* cited by examiner

METHOD FOR DEPOSITING INSULATING FILM ON RECESSED PORTION HAVING HIGH ASPECT RATIO

TECHNICAL FIELD

The present invention disclosed herein relates to methods of depositing an insulation layer, and more particularly, to methods of depositing an insulation layer on a trench having a high aspect ratio.

BACKGROUND ART

In line with the recent development of semiconductor industry and requirements of users, electronic devices have been highly integrated with high performance, and accordingly, high integration and high performance of a semiconductor device, as a key component of electronic devices, have been also required. However, there are difficulties in realizing a microstructure for obtaining a highly integrated semiconductor device.

For example, a thinner insulation layer is required for realizing the microstructure. However, when the insulation layer is formed to have a smaller thickness, qualities of the layer, such as insulating properties, may deteriorate. In particular, it becomes difficult to form a uniform, high quality insulation layer on an entire trench having a high aspect ratio while decreasing the thickness of the thin film.

DISCLOSURE

Technical Problem

The present invention provides a method capable of depositing an insulation layer having excellent quality and step coverage.

The present invention also provides a method capable of depositing a high quality insulation layer in a thickness direction of a trench even in a case in which the trench having a high aspect ratio is formed in the surface of a substrate.

These and other objects of the present invention will be more apparent from the following detailed description and the accompanying drawings.

Technical Solution

Embodiments of the present invention provide methods of depositing an insulation layer on a trench in a substrate, in which the trench having an aspect ratio of 5:1 or more is formed, including: an insulation layer deposition step of performing an adsorption step of adsorbing silicon to the substrate by injecting a silicon precursor into the inside of a chamber into which the substrate is loaded, a first purge step of removing the unreacted silicon precursor and reaction byproducts from the inside of the chamber, a reaction step of forming the adsorbed silicon as an insulation layer including silicon by supplying a first reaction source to the inside of the chamber, and a second purge step of removing the unreacted first reaction source and reaction byproducts from the inside of the chamber; and a densification step of forming a plasma atmosphere in the inside of the chamber by applying a radio frequency (RF) power and densifying the insulation layer including silicon by using the plasma atmosphere, wherein a frequency of the RF power is in a range of 400 kHz to 2 MHz.

In some embodiments, the densification step may be performed for 10 seconds when the insulation layer has a thickness of 50 Å.

In other embodiments, an output of the RF power may be in a range of 100 W to 3 kW, and the output of the RF power may be adjusted to be proportional to the frequency of the RF power.

In still other embodiments, the plasma atmosphere may be formed by a capacitively coupled plasma (CCP) method.

In even other embodiments, the first reaction source may be at least one gas selected from the group consisting of $O_2$, $O_3$, $N_2$, and $NH_3$.

In yet other embodiments, in the densification step, the plasma atmosphere may be formed by injecting at least one ignition gas selected from the group consisting of argon (Ar), helium (He), krypton (Kr), and xenon (Xe).

In further embodiments, in the densification step, at least one second reaction source selected from the group consisting of $H_2$, $O_2$, $O_3$, $N_2$, and $NH_3$ may be further injected with the ignition gas.

In still further embodiments, in the reaction step, $O_2$— (oxygen anion) or O* (oxygen radical) formed by using a plasma in an $O_2$ atmosphere may be used as the first reaction source.

In even further embodiments, in the insulation layer deposition step, an internal pressure of the chamber may be in a range of 0.05 Torr to 10 Torr, and an internal temperature of the chamber may be in a range of 50° C. to 700° C.

In yet further embodiments, the adsorption step, the first purge step, the reaction step, and the second purge step may be repeated 3 to 50 times before the densification step.

In much further embodiments, the insulation deposition step and the plasma treatment step may be repeated.

In still much further embodiments, a wet etch rate, based on using a 300:1 buffered oxide etchant (BOE) for 150 seconds, of the insulation layer subjected to the densification step may be 4 times or less that of an insulation layer by thermal chemical vapor deposition (CVD).

Advantageous Effects

According to an embodiment of the present invention, an insulation layer having excellent quality and step coverage may be formed. In particular, a high quality insulation layer may be deposited in a thickness direction of a trench even in a case in which the trench having a high aspect ratio is formed in the surface of a substrate.

BEST MODE

Hereinafter, preferred examples of the present invention will be described in more detail with reference to the accompanying FIGS. 1 to 12. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Thus, the size of each element may be exaggerated for convenience in description and clarity.

Figure 1:
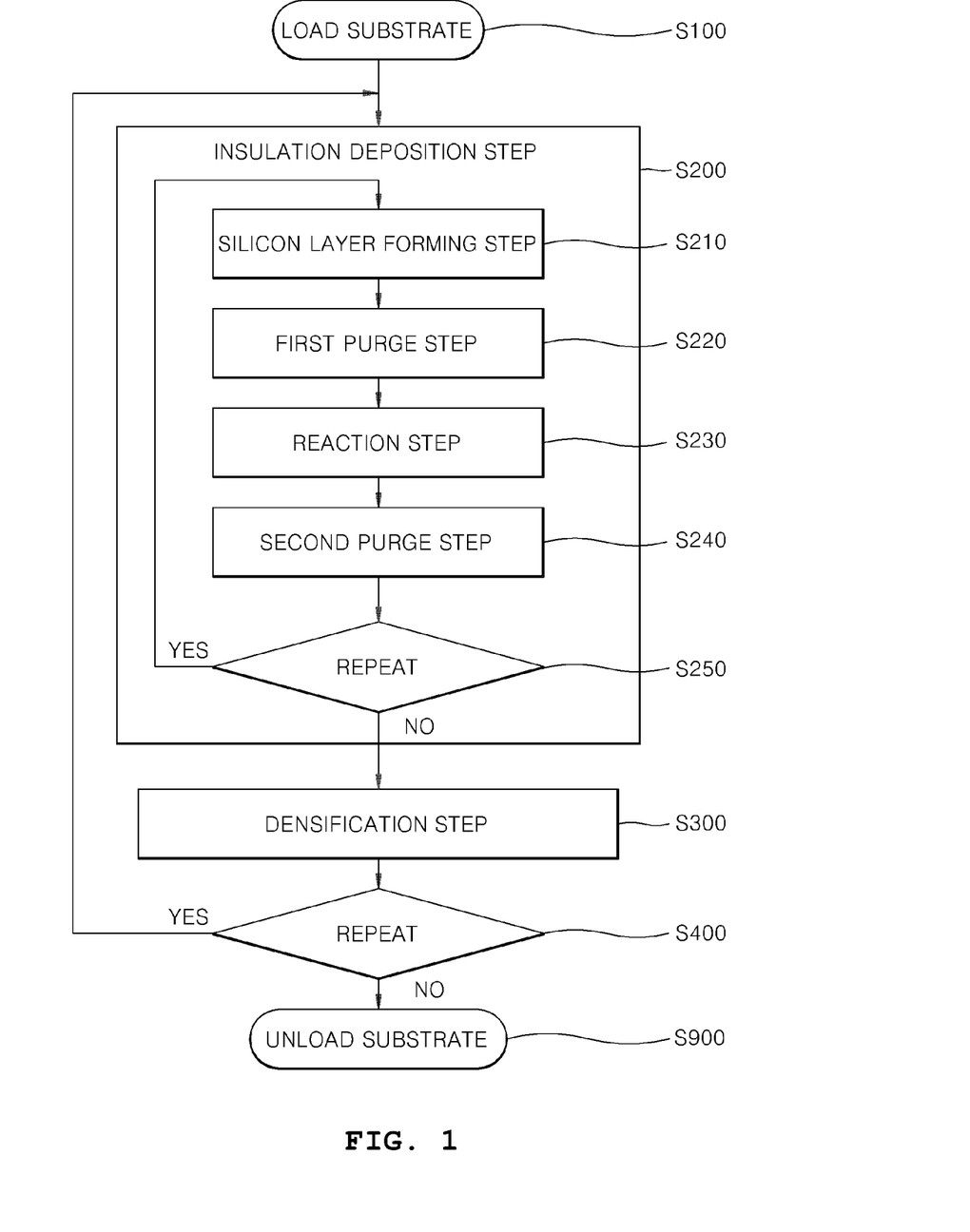
FIG. 1 is a flowchart illustrating a method of depositing an insulation layer according to an embodiment of the present invention.

FIG. 1 is a flowchart illustrating a method of depositing an insulation layer according to an embodiment of the present invention. As illustrated in FIG. 1, a substrate is loaded into a chamber of a semiconductor manufacturing apparatus (S100). An insulation layer is deposited on the substrate loaded into the chamber (S200), and the insulation layer deposition step S200 includes a silicon layer forming step S210, a first purge step S220, a reaction step S230, and a second purge step S240.

In order to form the silicon layer, a silicon precursor may be injected into the chamber to allow silicon to be adsorbed on the substrate (S210). The silicon layer is formed on the substrate, and the first purge step S220 of removing the unreacted silicon precursor and reaction byproducts is then performed.

Thereafter, the reaction step S230 is performed in which the silicon layer formed on the substrate is reacted with a reaction source to form an insulation layer including silicon. In order to form the silicon layer as the insulation layer including silicon, a first reaction source may be injected into the chamber. The first reaction source, for example, may be at least one gas selected from the group consisting of $O_2$, $O_3$, $N_2$, and $NH_3$.

In a case in which the insulation layer including silicon is a silicon oxide layer, the first reaction source may be a gas including oxygen atoms, such as $O_2$ or $O_3$, or $O_2$— (oxygen anion) or $O^*$ (oxygen radical) formed by using a plasma in an $O_2$ atmosphere. In a case in which the insulation layer including silicon is a silicon nitride layer, the first reaction source may be a gas including nitrogen atoms such as $N_2$ or $NH_3$.

Thereafter, the second purge step S240 of removing reaction byproducts and the reaction source or ignition gas from the inside of the chamber may be performed.

The silicon layer forming step S210, the first purge step S220, the reaction step S230, and the second purge step S240 may be repeatedly performed (S250). The silicon layer forming step S210, the first purge step S220, the reaction step S230, and the second purge step S240, for example, may be repeated 3 to 50 times.

During the insulation layer deposition step S200 including the silicon layer forming step S210, the first purge step S220, the reaction step S230, and the second purge step S240, a temperature of the substrate and a pressure in the chamber may be constantly maintained. In the silicon layer forming step S210, at least one silicon atom layer may be formed on the substrate. For example, the insulation layer including silicon may be formed to have a thickness of a few to a few tens of Å. The insulation layer including silicon is formed and a densification step S300 is then performed.

A plasma atmosphere may be formed in the chamber to densify the insulation layer including silicon. Also, together with the plasma atmosphere, a second reaction source may be further injected. The second reaction source, for example, may be at least one gas selected from the group consisting of $H_2$, $O_2$, $O_3$, $N_2$, and $NH_3$. In order to obtain an insulation layer including silicon and having a desired thickness, the insulation layer deposition step S200 and the densification step S300 may be repeatedly performed if necessary (S400). In a case in which the insulation layer including silicon and having a desired thickness is formed, the substrate may be unloaded from the chamber (S900).

Figure 2:
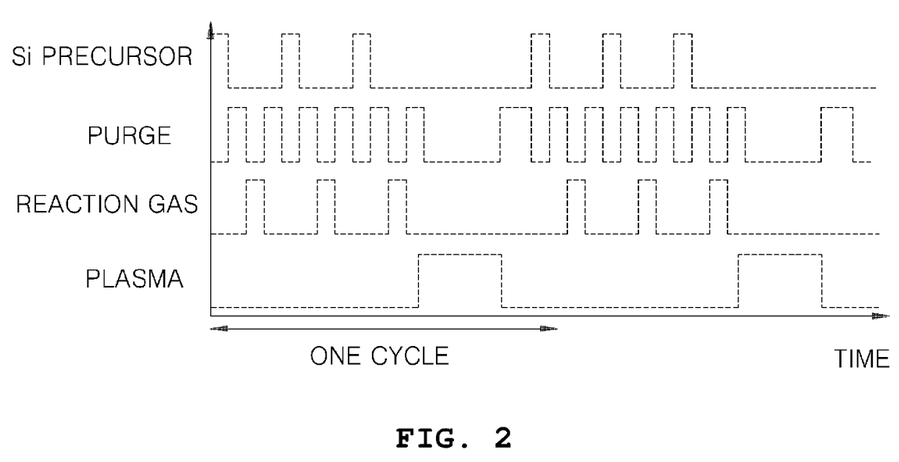
FIG. 2 is a diagram illustrating the progress of the method of depositing an insulation layer according to the embodiment of the present invention.

FIG. 2 is a diagram illustrating the progress of the method of depositing an insulation layer according to the embodiment of the present invention. As illustrated in FIG. 2, injection and purge of a silicon (Si) precursor and injection and purge of a first reaction source are repeatedly performed. The purge after the injection of the Si precursor and the purge after the injection of the first reaction source are repeatedly performed and a plasma atmosphere is then formed. In a state in which the plasma atmosphere is formed, a second reaction source may be injected if necessary.

From the step, in which the injection and purge of the silicon precursor and the injection and purge of the first reaction source are repeatedly performed, to the step of forming the plasma atmosphere is performed as one cycle. That is, the insulation layer including silicon is formed by repeatedly performing the injection and purge of the silicon precursor and the injection and purge of the first reaction source, and the insulation layer including silicon is then plasma-treated by forming the plasma atmosphere. Also, the insulation layer including silicon and having a desired thickness may be obtained by repeating all of the above-described processes. Thus, in the method of depositing an insulation layer, the injection and purge of the silicon precursor and the injection and purge of the first reaction source may not only be repeatedly performed, but the formation of the insulation layer including silicon and the plasma treatment may also be repeatedly performed.

Based on the above description and referring to FIGS. 3A to 6B, the method of depositing an insulation layer according to the embodiment of the present invention will be described in detail step-by-step. In descriptions related to FIGS. 3A to 6B, reference numerals in FIGS. 1 and 2 may be used together if necessary.

Figure 3A:
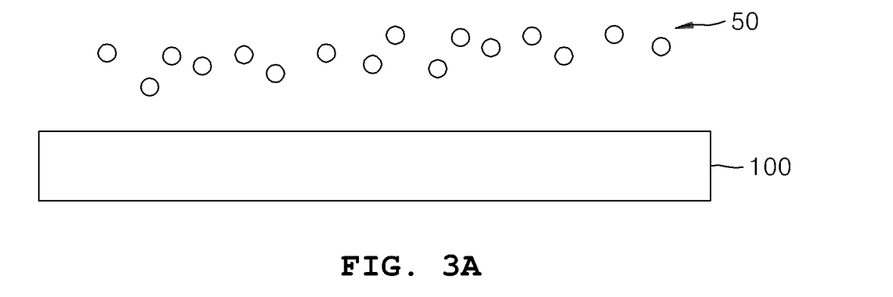
FIGS. 3A to 3C are cross-sectional views illustrating a step of forming a silicon layer according to an embodiment of the present invention.
Figure 3B:
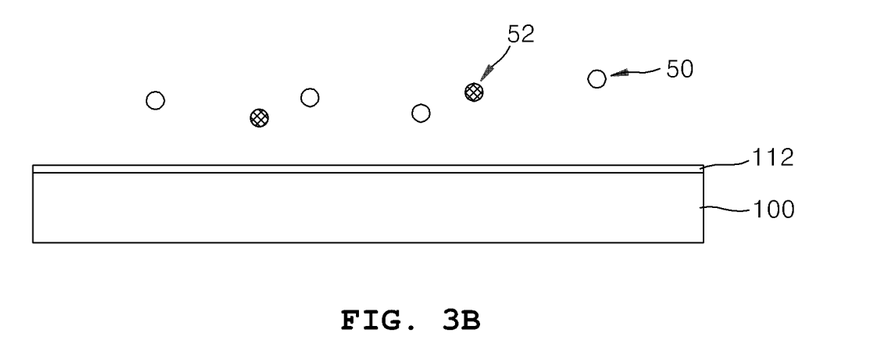
Figure 3C:
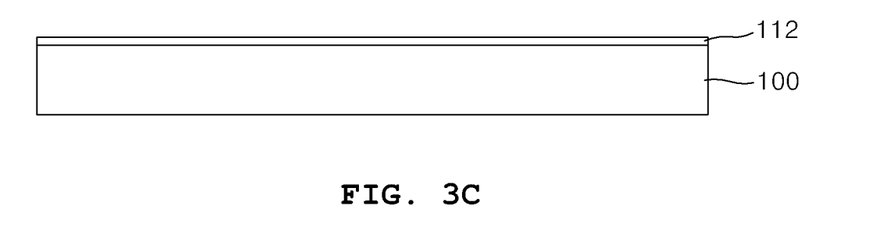

FIGS. 3A to 3C are cross-sectional views illustrating a step of forming a silicon layer according to an embodiment of the present invention. FIG. 3A is a cross-sectional view illustrating a step of injecting a silicon precursor according to an embodiment of the present invention.

Referring to FIG. 3A, a silicon precursor 50 is injected into a chamber into which a substrate 100 is loaded. The substrate 100, for example, may include a semiconductor substrate such as a silicon or compound semiconductor wafer. Also, the substrate 100 may include a substrate material different from a semiconductor, for example, glass, metal, ceramic, or quartz. The silicon precursor 50, for example, may be an amino-based silane, such as bisethylmethylaminosilane (BEMAS), bisdimethylaminosilane (BDMAS), bisdiethylaminosilane (BDEAS), tetrakisethylmethylaminosilane (TEMAS), tetrakisdimethylaminosilane (TDMAS), and tetrakisdiethylaminosilane (TDEAS), or a chloride-based silane such as hexachlorinedisilane (HCD). A temperature of the substrate 100 may be maintained in a range of 50° C. to 700° C. so as to allow the substrate 100 to react with the silicon precursor 50. Also, a pressure in the chamber into which the substrate 100 is loaded may be maintained in a range of 0.05 Torr to 10 Torr.

FIG. 3B is a cross-sectional view illustrating an appearance in which a silicon layer is formed on the substrate according to the embodiment of the present invention. Referring to FIG. 3B, silicon is adsorbed on the substrate 100 by the reaction of a portion of the silicon precursor 50 with the substrate 50 and thus, a silicon layer 112 may be formed. The silicon layer 112 may be composed of at least one silicon atom layer. The silicon precursor 50 may form byproducts 52 after the reaction with the substrate 100. Also, another portion of the silicon precursor 50 may not react with the substrate 100 and may remain in an unreacted state.

FIG. 3C is a cross-sectional view illustrating an appearance in which a first purge step according to an embodiment of the present invention is performed. Referring to FIG. 3C, the silicon layer 112 is formed on the substrate 100, and a purge for removing the remaining silicon precursor 50 in an unreacted state and the reaction byproducts 52 from the inside of the chamber may then be performed. A purge step, in which the unreacted silicon precursor 50 and the reaction byproducts 52 are removed from the inside of the chamber, may be referred to as the first purge step. During the first purge step, the temperature of the substrate 100 may be maintained in a range of 50° C. to 700° C. Also, the pressure in the chamber into which the substrate 100 is loaded may be maintained in a range of 0.05 Torr to 10 Torr. That is, the temperature of the substrate 100 and the pressure in the chamber during the step of forming the silicon layer 112 and the first purge step may be constantly maintained.

Figure 4A:
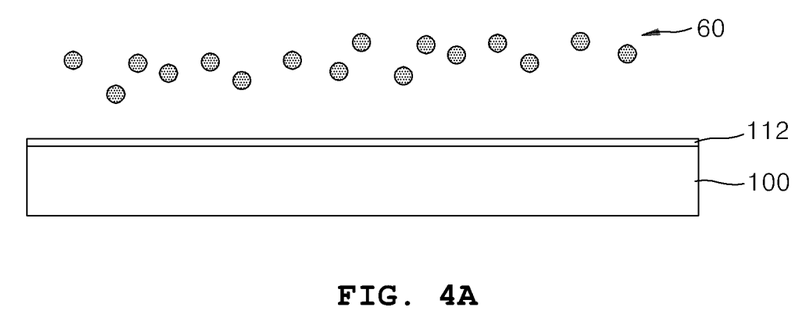
FIGS. 4A to 4C are cross-sectional views illustrating a step of forming an insulation layer according to an embodiment of the present invention.
Figure 4B:
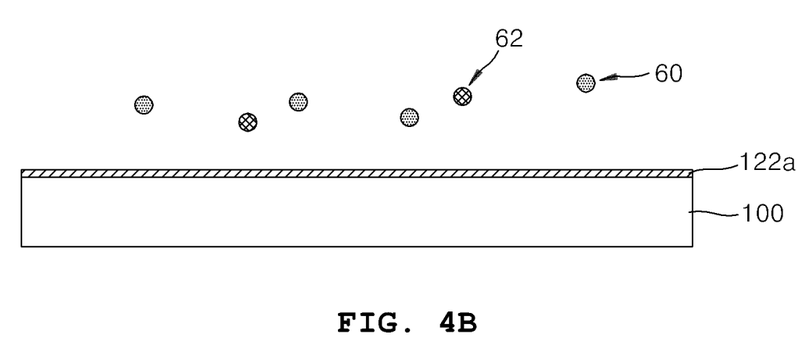
Figure 4C:
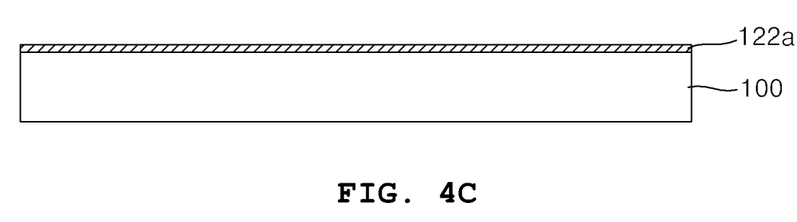

FIGS. 4A to 4C are cross-sectional views illustrating a step of forming an insulation layer including silicon according to an embodiment of the present invention. FIG. 4A is a cross-sectional view illustrating a step of injecting a reaction source according to an embodiment of the present invention. Referring to FIG. 4A, a first reaction source 60 is injected into a chamber into which a substrate 100 is loaded. The first reaction source 60, for example, may be at least one gas selected from the group consisting of $O_2$, $O_3$, $N_2$, and $NH_3$. Also, the first reaction source 60, for example, may be $O_2$— (oxygen anion) or $O^*$ (oxygen radical) formed by using a plasma in an $O_2$ atmosphere. A temperature of the substrate 100 may be maintained in a range of 50° C. to 700° C. so as to allow the substrate 100 to react with the first reaction source 60. Also, a pressure in the chamber into which the substrate 100 is loaded may be maintained in a range of 0.05 Torr to 10 Torr.

FIG. 4B is a cross-sectional view illustrating an appearance in which an insulation including silicon is deposited on the substrate according to the embodiment of the present invention. Referring to FIG. 4B, an insulation layer 122a including silicon may be formed on the substrate 100 by the reaction of a portion of the first reaction source 60 with the silicon layer 112. The first reaction source 60 may form reaction byproducts 62 after the reaction with the silicon layer 112. Also, another portion of the first reaction source 60 may not react with the silicon layer 112 and may remain in an unreacted state.

In a case in which a gas including oxygen atoms, such as $O_2$ or $O_3$, or $O_2$— (oxygen anion) or $O^*$ (oxygen radical) formed by using a plasma in an $O_2$ atmosphere, for example, is used as the first reaction source 60, the silicon layer 112 may be formed as a silicon oxide layer by reacting with the oxygen atoms included in the first reaction source 60. In a case in which a gas including nitrogen atoms, such as $N_2$ or $NH_3$, for example, is used as the first reaction source 60, the silicon layer 112 may be formed as a silicon nitride layer by reacting with the nitrogen atoms included in the first reaction source 60.

FIG. 4C is a cross-sectional view illustrating an appearance in which a second purge step according to an embodiment of the present invention is performed. Referring to FIG. 4C, the insulation layer 122a including silicon is formed on the substrate 100 and a purge for removing the remaining first reaction source 60 in an unreacted state and the reaction byproducts 62 from the inside of the chamber may then be performed. A purge step, in which the unreacted first reaction source 60 and the reaction byproducts 62 are removed from the inside of the chamber, may be referred to as the second purge step. During the second purge step, the temperature of the substrate 100 may be maintained in a range of 50° C. to 700° C. Also, the pressure in the chamber into which the substrate 100 is loaded may be maintained in a range of 0.05 Torr to 10 Torr.

Figure 5:
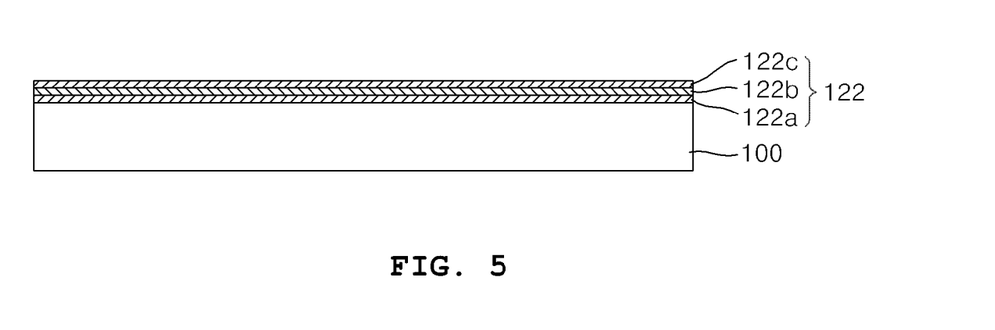
FIG. 5 is a cross-sectional view illustrating an appearance in which a plurality of insulation layers according to an embodiment of the present invention is formed.

FIG. 5 is a cross-sectional view illustrating an appearance in which a plurality of insulation layers including silicon according to an embodiment of the present invention is formed. Referring to FIG. 5, an insulation layer 122 composed of a plurality of insulation layers 122a, 122b, and 122c including silicon is formed by repeating the steps illustrated in FIGS. 3A to 4C. The insulation layer 122 may have a thickness of a few to a few tens of Å. The process of depositing each insulation layer 122a, 122b, or 122c including silicon may be repeated 3 to 50 times so as to allow the insulation layer 122 to include 3 to 10 insulation layers 122a, 122b, and 122c including silicon. When the insulation layer 122 is formed of the plurality of insulation layers 122a, 122b, and 122c including silicon, the insulation layer 122 may have excellent quality and step coverage.

Figure 6A:
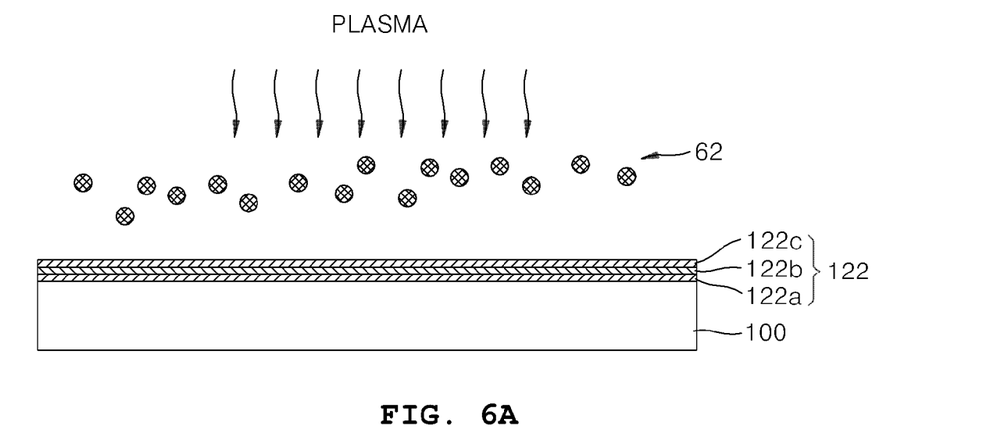
FIGS. 6A and 6B are cross-sectional views illustrating a step of densifying the insulation layer according to the embodiment of the present invention.
Figure 6B:
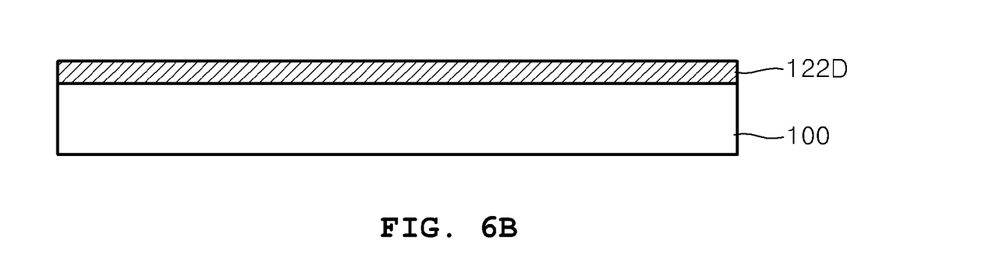

FIGS. 6A and 6B are cross-sectional views illustrating a step of densifying the insulation layer according to the embodiment of the present invention. FIG. 6 is a cross-sectional view illustrating an appearance in which a plasma atmosphere is provided to the insulation layer including silicon according to the embodiment of the present invention. Referring to FIG. 6, a plasma is applied to the substrate 100 having the insulation layer 122 formed thereon. That is, a plasma atmosphere is formed in the chamber into which the substrate 100 is loaded. A capacitively coupled plasma (CCP) method may be used to form the plasma atmosphere, and a CCP electrode (e.g., round or square) is connected to a radio frequency (RF) power source through a matcher. The RF power source may have a frequency of 400 kHz to 2 MHz and an output power of 100 W to 3 kW. The output power may be adjusted to be proportional to the frequency of the RF power source.

At least one ignition gas selected from the group consisting of argon (Ar), helium (He), krypton (Kr), and xenon (Xe), for example, may be injected to form the plasma atmosphere. In this case, the ignition gas may be injected at a flow rate of 50 sccm to 3,000 sccm. A second reaction source 64 may be further injected to more densify the insulation layer 122 in the plasma atmosphere. The second reaction source 64, for example, may be at least one gas selected from the group consisting of $O_2$, $O_3$, $N_2$, and $NH_3$, or $O_2$— (oxygen anion) or $O^*$ (oxygen radical) formed by using a plasma in an $O_2$ atmosphere.

In a case in which the insulation layer 122 is a silicon oxide layer, a gas including oxygen atoms, such as $O_2$ or $O_3$, $O_2$— (oxygen anion) or $O^*$ (oxygen radical) formed by using a plasma in an $O_2$ atmosphere, or $H_2$, for example, may be used as the second reaction source 64. In a case in which the insulation layer 122 is a silicon nitride layer, a gas including nitrogen atoms, such as $N_2$ or $NH_3$, for example, may be used as the second reaction source 64.

FIG. 6B is a cross-sectional view illustrating an appearance in which an insulation layer 122D according to an embodiment of the present invention is formed. Referring to both FIGS. 6A and 6B, the densification of the insulation layer 122 is performed in the plasma atmosphere and thus, the densified insulation layer 122D may be formed. The pressure of the chamber into which the substrate 100 is loaded may be maintained in a range of 0.05 Torr to 10 Torr to form the densified insulation layer 122D. Also, the densified insulation layer 122D obtained by treating the insulation layer 122 in the plasma atmosphere may have excellent quality such as insulating properties. In particular, the densified insulation layer 122D may have excellent quality even if the densified insulation layer 122D is formed to have a small thickness.

For example, in a case where an oxidation layer is deposited by using an atomic layer deposition (ALD) method at a relatively low temperature of about 300° C. to about 650° C., the thin film has a higher etch rate than a thermal oxide layer (oxide layer obtained by an oxidation treatment while heating a silicon substrate). Thus, it may be considered that the silicon oxide layer deposited by the ALD method has a lower density than the thermal oxide layer. The density of the thin film may be improved by the above-described densification treatment.

FIGS. 7A to 7D are cross-sectional views illustrating an appearance in which the insulation layer according to the embodiment of the present invention is deposited on a trench that is formed in the surface of a substrate, and the above-described method of depositing an insulation layer may be used.

Figure 7A:
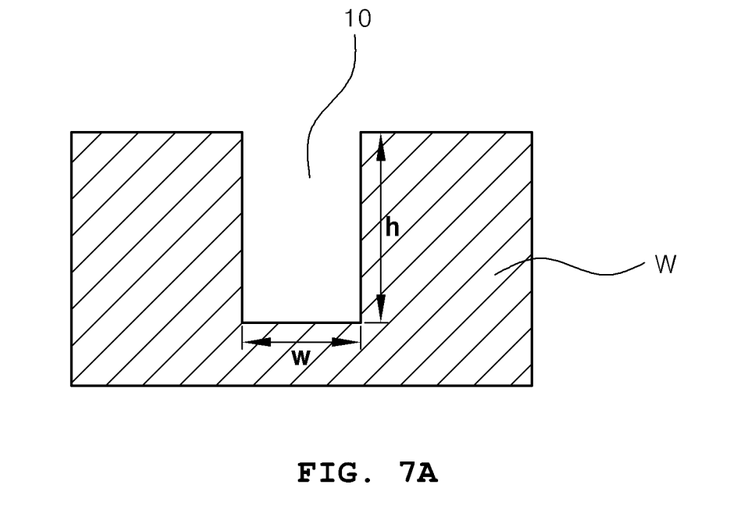
FIGS. 7A to 7D are cross-sectional views illustrating an appearance in which the insulation layer according to the embodiment of the present invention is deposited on a trench that is formed in the surface of a substrate.
Figure 7B:
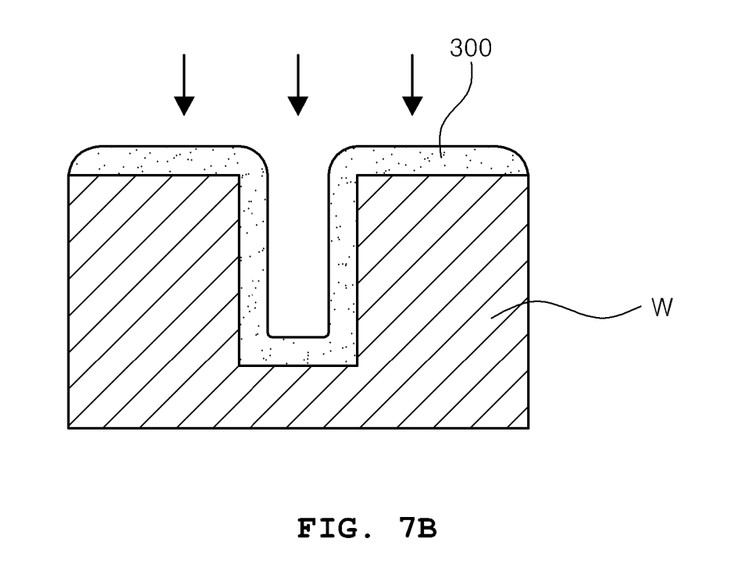

That is, a trench 10 composed of a groove or hole is formed in a surface of a substrate W, and the trench 10 has an aspect ratio (AR=a height h of the trench:a width w of the trench) (see FIG. 7a). For example, the trench may have a depth of 300 nm to 10 μm and a width of 10 nm to 200 nm.

A component of a silicon precursor is adsorbed on the surface of the substrate W to form a silicon adsorption layer 300 (see FIG. 7B), and thereafter, the adsorption layer 300 is oxidized or nitrided by the first reaction source 60 to form a single molecular layer or multiple molecular layers of a silicon oxide layer or silicon nitride layer as a component of a thin film. Thus, an insulation layer 301, as a reaction product, is formed (see FIG. 7C). In the insulation layer 301, for example, there is a case in which impurities, such as moisture (OH group) or an organic material, may remain due to a residual group included in the silicon precursor.

Figure 7C:
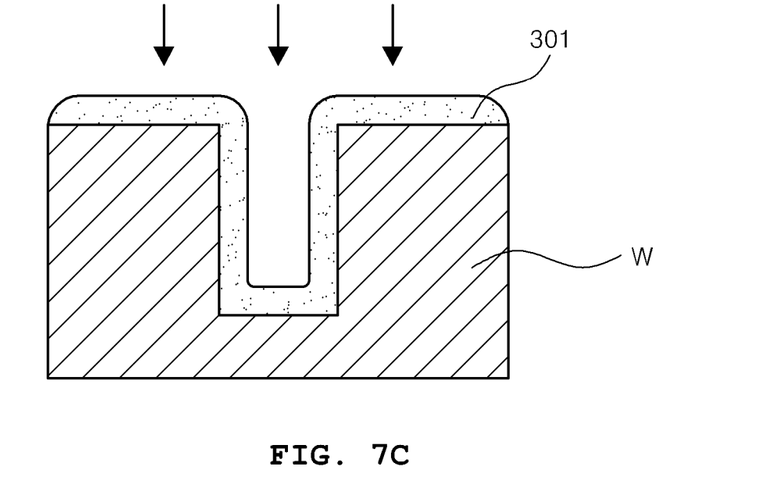
Figure 7D:
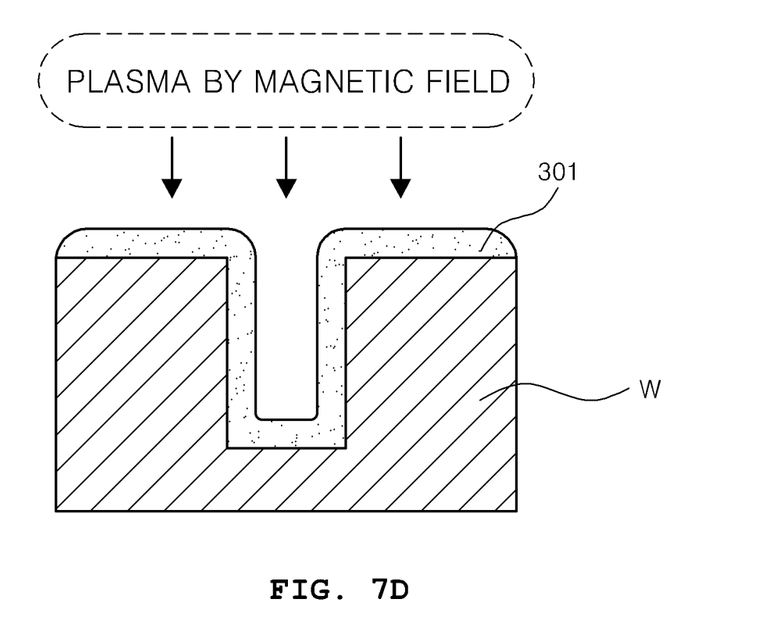

Thereafter, high-frequency power is supplied by a RF power source to form an electric field and a magnetic field, and the ignition gas or the second reaction source 64 is activated by the magnetic field to form a plasma containing, for example, ions or radicals. Since the plasma collides against the surface of the substrate W, the impurities, such as moisture or an organic material, may be released from the insulation layer 301 or elements in the insulation layer 301 may be rearranged to densify the insulation layer 301.

However, in a case in which the trench 10, such as a hole or groove, having a high aspect ratio (e.g., 5:1 or more) is formed in the surface of the substrate, a degree of densification may change in a depth direction of the trench 10. That is, in a case in which the trench 10 having a high aspect ratio is formed, it is difficult for the plasma (or ions) to enter into the trench 10. Thus, in the trench 10, the degree of densification decreases in a direction toward the bottom. In other words, the densification treatment is well performed on the surface of the insulation layer 301 and the bottom of the trench 10 to form a dense thin film, but a low density (porous) thin film is obtained in the direction toward the bottom of the trench 10. Thus, there is a need to form a dense thin film along the depth direction of the trench 10.

Figure 8:
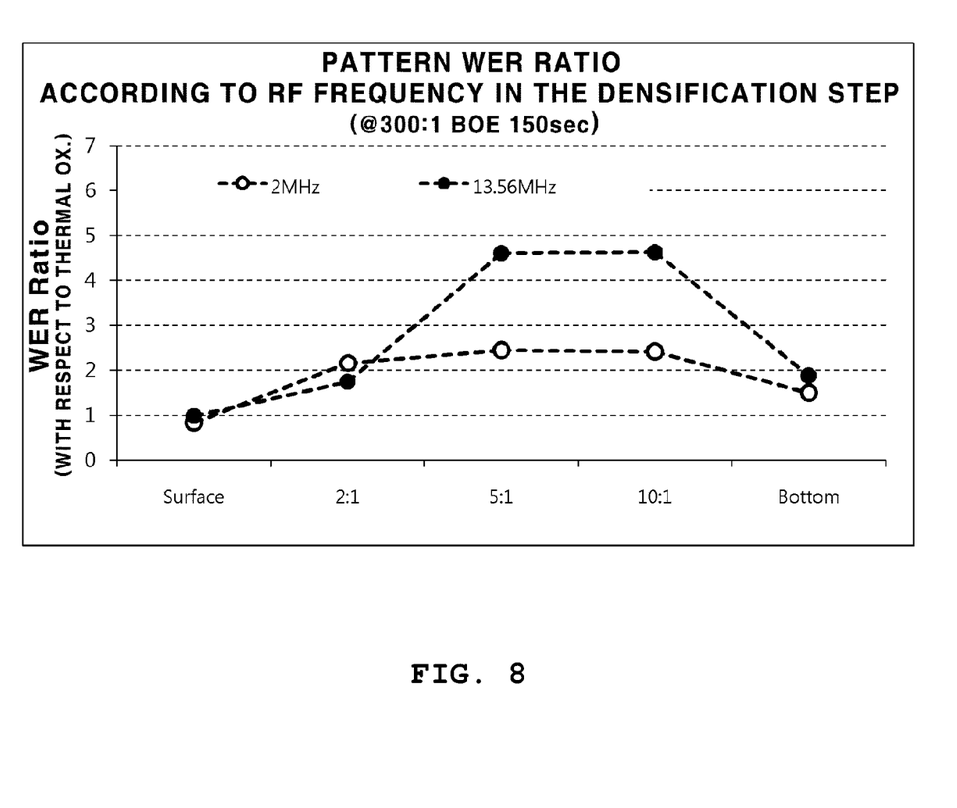
FIGS. 8 to 10 are graphs which compares wet etch rates of oxide layers deposited on trenches, according to the embodiment of the present invention, depending on the frequency.
Figure 9:
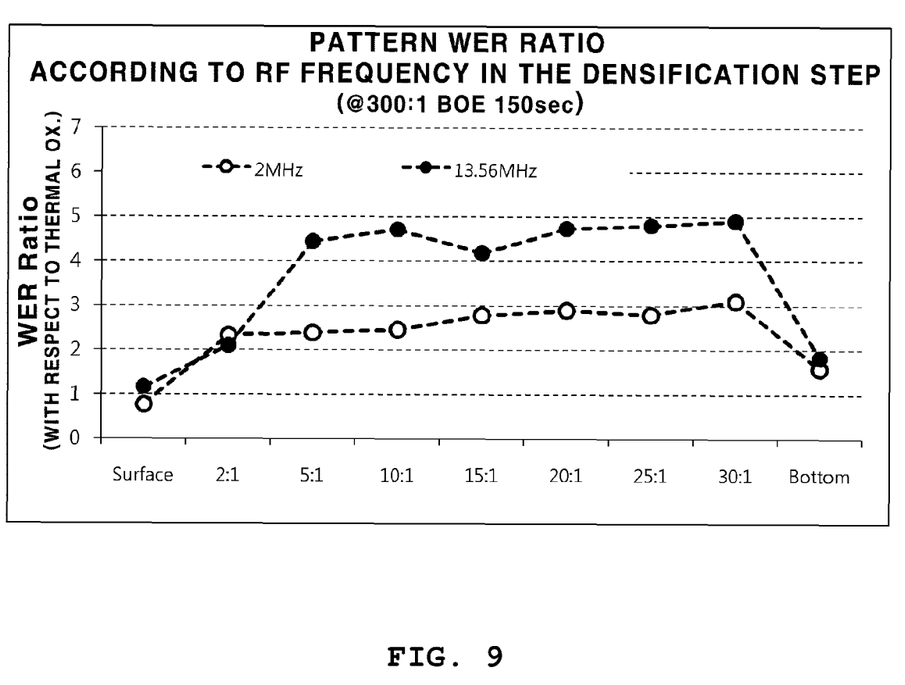
Figure 10:
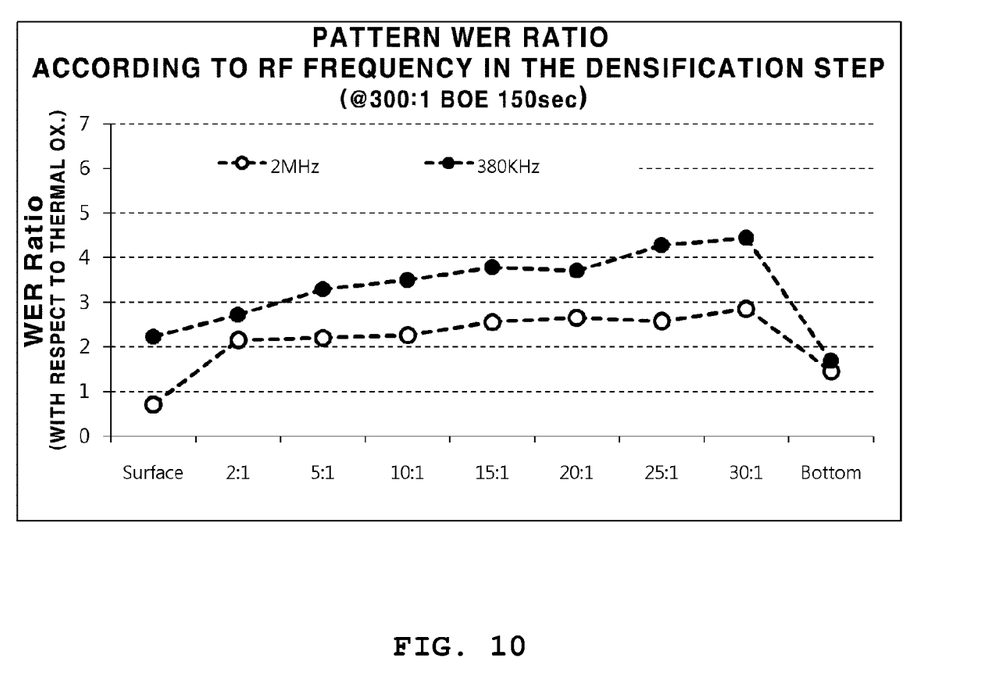

FIGS. 8 to 10 are graphs which compares wet etch rates of the oxide layers deposited on the trenches, according to the embodiment of the present invention, depending on the frequency, wherein the wet etch rate is represented as a ratio to a wet etch rate of the above-described thermal oxide layer.

FIG. 8 illustrates the wet etch rate of the oxide layer depending on the frequency of the RF power source along the depth of the trench 10 when the aspect ratio of the trench 10 is 10:1. First, as illustrated in FIG. 8, since differences in wet etch rates of the surface (point where the depth is 0) of the oxide layer, the bottom (point where the depth is maximum) of the trench 10, and a point where the aspect ratio is 2:1 (inner wall of a point where the depth from the surface is 2 when the depth of the trench is 10) depending on the frequency (13.56 MHz and 2 MHz) are insignificant, it may be understood that the densification treatment is performed on each point so that the insulation layer is densified. However, the differences in wet etch rates depending on the frequency are clearly observed at points where the aspect ratios are 5:1 and 10:1, and since the densification treatment is not performed in a case in which the frequency is 13.56 MHz, it may be understood that the density of the insulation layer is low. That is, at the points where the aspects ratios are 5:1 and 10:1, in a case in which the frequency of the RF power source is a widely used frequency, i.e., 13.56 MHz, the wet etch rates are about 4.8 times higher (worse) than those of the thermal oxide layers. However, in a case in which the frequency of the RF power source is 2 MHz, it may be understood that the wet etch rates are about 2.4 to 5 times higher (worse) than those of the thermal oxide layers.

FIG. 9 illustrates the wet etch rate of the oxide layer depending on the frequency of the RF power source along the depth of the trench 10 when the aspect ratio of the trench 10 is 30:1. First, as illustrated in FIG. 9, since differences in wet etch rates of the surface (point where the depth is 0) of the oxide layer, the bottom (point where the depth is maximum) of the trench 10, and a point where the aspect ratio is 2:1 (inner wall of a point where the depth from the surface is 2 when the depth of the trench is 30) depending on the frequency (13.56 MHz and 2 MHz) are insignificant, it may be understood that the densification treatment is performed on each point so that the insulation layer is densified. However, the differences in wet etch rates depending on the frequency are clearly observed at points where the aspect ratios are in a range of 5:1 to 30:1, and since the densification treatment is not performed in a case in which the frequency is 13.56 MHz, it may be understood that the density of the insulation layer is low. That is, at the points where the aspects ratios are in a range of 5:1 to 30:1, in a case in which the frequency of the RF power source is a widely used frequency, i.e., 13.56 MHz, the wet etch rates are about 4.2 to 9 times higher (worse) than those of the thermal oxide layers. However, in a case in which the frequency of the RF power source is 2 MHz, it may be understood that the wet etch rates are about 2.4 to 3.1 times higher (worse) than those of the thermal oxide layers.

FIG. 10 illustrates the wet etch rate of the oxide layer along the depth of the trench 10 when the aspect ratio of the trench 10 is 30:1 and the frequency of the RF power source is 380 kHz. As illustrated in FIG. 10, in a case in which the frequency of the RF power source is 380 kHz, i.e., less than 2 MHz, since differences in wet etch rates of the bottom of the trench 10 depending on the frequency (380 kHz and 2 MHz) are insignificant, it may be understood that the densification treatment is performed so that the insulation layer is densified. However, the differences in wet etch rates depending on the frequency are clearly observed at points excluding the bottom of the trench 10, and, different from the description of FIG. 9, since the densification treatment is not performed even at the surface (point where the depth is 0) of the oxide layer and a point where the aspect ratio is 2:1 (inner wall of a point where the depth from the surface is 2 when the depth of the trench is 30), it may be understood that the density of the insulation layer is low.

Figure 11:
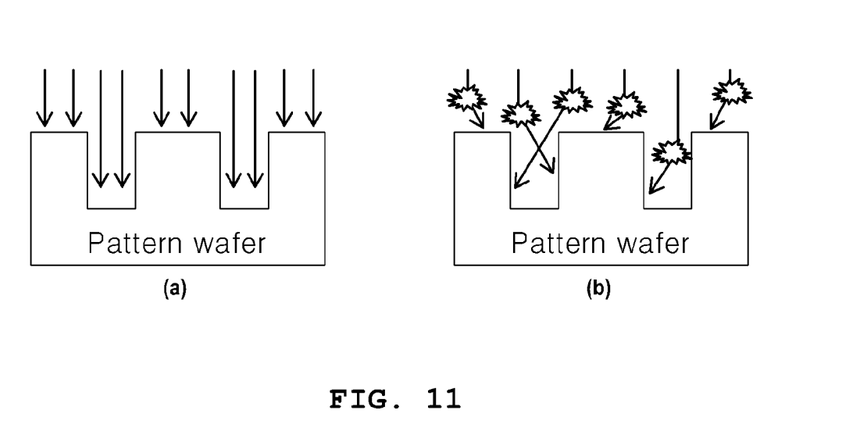
FIG. 11 is a cross-sectional view illustrating a mode in which a plasma moves on the substrate.
Figure 12:
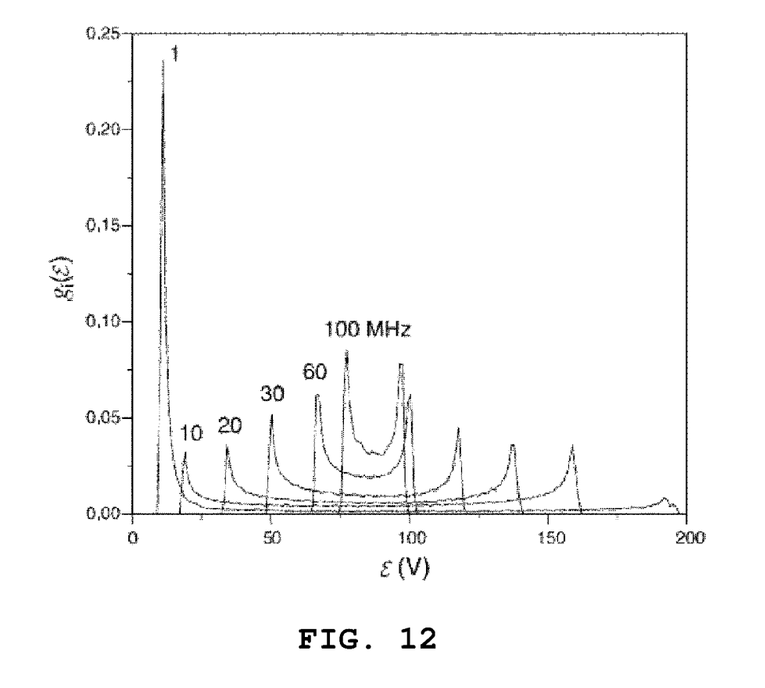
FIG. 12 is a graph illustrating ion energy according to the frequency of RF power applied during the formation of plasma.

FIG. 11 is a cross-sectional view illustrating a mode in which a plasma moves on the substrate, and FIG. 12 is a graph illustrating ion energy according to the frequency of RF power applied during the formation of plasma. The presence of the densification treatment described through FIGS. 8 to 10 will be described below.

As described above, since the plasma collides against the surface of the substrate W, impurities, such as moisture or an organic material, may be released from the oxide layer or elements in the insulation layer 301 may be rearranged to densify the oxide layer. However, in a case in which the trench 10, such as a hole or groove, having a high aspect ratio (e.g., 5:1 or more) is formed in the surface of the substrate, a degree of densification may change in a depth direction of the trench 10. That is, in a case in which the trench 10 having a high aspect ratio is formed, it is difficult for the plasma (or ions) to enter into the trench. Thus, in the trench 10, the degree of densification decreases in a direction toward the bottom. In other words, the densification treatment is well performed on the surface of the insulation layer 301 and the bottom of the trench 10 to form a dense thin film, but a low density (porous) thin film is obtained in the direction toward the bottom of the trench 10. Thus, there is a need to form a dense thin film along the depth direction of the trench 10.

The above-described phenomenon is considered to occur due to the linearity of the plasma. That is, since a movement direction of the plasma is parallel to the inner wall of the trench 10, the possibility of the plasma colliding with the inner wall of the trench 10 is low. Also, since the bottom of the trench 10 is perpendicular to the movement direction of the plasma, the bottom of the trench 10 may sufficiently collide with the plasma to absorb a significant amount of impact energy. In contrast, since the inner wall of the trench 10 is generally parallel to the movement direction of the plasma, the inner wall of the trench may not sufficiently collide with the plasma even if the plasma collides with the inner wall of the trench and may not absorb a significant amount of impact energy (see FIG. 11(a))

Thus, only when ions included in the plasma collide at least once with neutral atoms to considerably change their directions, the ions may sufficiently collide with the inner wall of the trench 10 so that the inner wall of the trench 10 may absorb a significant amount of impact energy (see FIG. 11(b)). However, since the ions may lose a significant amount of energy during the collision between the ions and the neutral atoms, the ions may not have a sufficient energy to induce the densification even if the ions change their directions to collide with the inner wall of the trench 10 as described above. Therefore, the ions of the initially formed plasma may induce the densification of the inner wall of the trench 10 only when the energy of the ions is above a predetermined level.

As illustrated in FIG. 12, the smaller the frequency of the RF power is, the wider the distribution of the ion energy is and ions having higher energy are distributed. Accordingly, ions having relatively high energy may collide with the inner wall of the trench 10 to induce the densification. However, when the frequency is excessively low, since the number of ions may be decreased even if the ions having higher energy are formed, the densification of the oxide layer may not be induced. Thus, the frequency of the RF power may be in a range of 400 kHz to 2 MHz, and as illustrated in FIGS. 8 to 10, the density of the oxide layer may be improved by densifying the inner wall of the trench 10.

The output power of the RF power source may be in a range of 100 W to 3 kW, and the output power may be adjusted to be proportional to the frequency of the RF power source. Since the ions having high energy are distributed as the frequency decreases, a sputtering effect may significantly occur at edge portions of the entrance of the trench 10 when the output power of the RF power source is increased, and thus, the shape of the trench 10 may be damaged or distorted. Therefore, there is a need to adjust the output power of the RF power source to be proportional to the frequency.

Although the CCP is used in the present embodiment, an inductively coupled plasma (ICP) may be used alternatively.

While preferred embodiments of the present invention has been particularly shown and described with reference to the accompanying drawings, it will be understood by those of ordinary skill in the art that various changes in form and details may be made therein without departing from the spirit and scope of the present invention as defined by the following claims. Accordingly, it is to be understood that the invention is not to be limited by the disclosed embodiments, but only by the scope of the appended claims.

INDUSTRIAL APPLICABILITY

The present invention may be applicable to a various apparatus for manufacturing semiconductor or a various method for manufacturing semiconductor.

What is claimed is:

1. A method of depositing an insulation layer on a trench in a substrate in which the trench having an aspect ratio of 5:1 or more is formed, the method comprising:
   an insulation layer deposition step of performing
      an adsorption step of adsorbing silicon to the substrate by injecting a silicon precursor into an inside of a chamber into which the substrate is loaded,
      a first purge step of removing the unreacted silicon precursor and reaction byproducts from the inside of the chamber,
      a reaction step of forming the adsorbed silicon as an insulation layer including silicon by supplying a first reaction source to the inside of the chamber, and
      a second purge step of removing the unreacted first reaction source and reaction byproducts from the inside of the chamber; and a densification step of forming a plasma atmosphere in the inside of the chamber by applying a radio frequency (RF) power and densifying the insulation layer including silicon by using the plasma atmosphere, wherein a frequency of the RF power in the densification step is 2 MHz.

2. The method of claim 1, wherein a wet etch rate, based on using a 300:1 buffered oxide etchant (BOE) for 150 seconds, of the insulation layer subjected to the densification step is 4 times or less that of an insulation layer by thermal chemical vapor deposition (CVD).

3. The method of claim 1, wherein the densification step is performed for 2 seconds to 50 seconds when the insulation layer has a thickness of 50 Å.

4. The method of claim 3, wherein a wet etch rate, based on using a 300:1 buffered oxide etchant (BOE) for 150 seconds, of the insulation layer subjected to the densification step is 4 times or less that of an insulation layer by thermal chemical vapor deposition (CVD).

5. The method of claim 1, wherein an output of the RF power is in a range of 100 W to 3 kW, and the output of the RF power is adjusted to be proportional to the frequency of the RF power.

6. The method of claim 5, wherein a wet etch rate, based on using a 300:1 buffered oxide etchant (BOE) for 150 seconds, of the insulation layer subjected to the densification step is 4 times or less that of an insulation layer by thermal chemical vapor deposition (CVD).

7. The method of claim 1, wherein the plasma atmosphere is formed by a capacitively coupled plasma (CCP) method.

8. The method of claim 7, wherein a wet etch rate, based on using a 300:1 buffered oxide etchant (BOE) for 150 seconds, of the insulation layer subjected to the densification step is 4 times or less that of an insulation layer by thermal chemical vapor deposition (CVD).

9. The method of claim 1, wherein the first reaction source is at least one gas selected from the group consisting of $O_2$, $O_3$, $N_2$, and $NH_3$.

10. The method of claim 9, wherein a wet etch rate, based on using a 300:1 buffered oxide etchant (BOE) for 150 seconds, of the insulation layer subjected to the densification step is 4 times or less that of an insulation layer by thermal chemical vapor deposition (CVD).

11. The method of claim 1, wherein, in the densification step, the plasma atmosphere is formed by injecting at least one ignition gas selected from the group consisting of argon (Ar), helium (He), krypton (Kr), and xenon (Xe).

12. The method of claim 11, wherein a wet etch rate, based on using a 300:1 buffered oxide etchant (BOE) for 150 seconds, of the insulation layer subjected to the densification step is 4 times or less that of an insulation layer by thermal chemical vapor deposition (CVD).

13. The method of claim 11, wherein, in the densification step, at least one second reaction source selected from the group consisting of $H_2$, $O_2$, $O_3$, $N_2$, and $NH_3$ is further injected with the ignition gas.

14. The method of claim 13, wherein a wet etch rate, based on using a 300:1 buffered oxide etchant (BOE) for 150 seconds, of the insulation layer subjected to the densification step is 4 times or less that of an insulation layer by thermal chemical vapor deposition (CVD).

15. The method of claim 1, wherein, in the reaction step, $O_2$— (oxygen anion) or O* (oxygen radical) formed by using a plasma in an $O_2$ atmosphere is used as the first reaction source.

16. The method of claim 15, wherein a wet etch rate, based on using a 300:1 buffered oxide etchant (BOE) for 150 seconds, of the insulation layer subjected to the densification step is 4 times or less that of an insulation layer by thermal chemical vapor deposition (CVD).

* * * * *